(12) United States Patent
Huang

(10) Patent No.: US 10,375,333 B2
(45) Date of Patent: Aug. 6, 2019

(54) IMAGE SENSING DEVICE CAPABLE OF SENSING IMAGES AND TEMPERATURES

(71) Applicant: Novatek Microelectronics Corp., Hsinchu (TW)

(72) Inventor: Dong-Hai Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 143 days.

(21) Appl. No.: 15/792,770

(22) Filed: Oct. 25, 2017

(65) Prior Publication Data

US 2019/0124286 A1    Apr. 25, 2019

(51) Int. Cl.
*H04N 5/374* (2011.01)
*H01L 27/146* (2006.01)
*H04N 9/04* (2006.01)

(52) U.S. Cl.
CPC ....... *H04N 5/3741* (2013.01); *H01L 27/1463* (2013.01); *H01L 27/14643* (2013.01); *H04N 9/045* (2013.01)

(58) Field of Classification Search
CPC .. H04N 5/3741; H04N 9/045; H01L 27/1463; H01L 27/14643
USPC .............................................. 250/208.1, 238
See application file for complete search history.

(56) References Cited

U.S. PATENT DOCUMENTS

| 7,990,441 | B2 | 8/2011 | Lee | |
|---|---|---|---|---|
| 8,866,060 | B2 | 10/2014 | Kwon et al. | |
| 9,234,804 | B2 | 1/2016 | Englasyam et al. | |
| 2008/0158378 | A1* | 7/2008 | Lee | H04N 5/357 348/222.1 |
| 2012/0241639 | A1* | 9/2012 | Yagi | G01T 1/244 250/394 |
| 2015/0070488 | A1 | 3/2015 | Wang et al. | |

* cited by examiner

*Primary Examiner* — Seung C Sohn
(74) *Attorney, Agent, or Firm* — JCIPRNET

(57) ABSTRACT

An image sensing device including a plurality of pixel circuits arranged in an array and configured to sense images and temperatures is provided. Each of the pixel circuits includes a photo sensing device, a transmission gate transistor, a reset transistor and an output stage circuit. The first end of the transmission gate transistor is coupled to the first end of the photo sensing device. The second end of the photo sensing device is coupled to a first voltage or a second voltage. The first end of the reset transistor is coupled to a first power, a first current bias or a second current bias. The second end of the reset transistor is coupled to the second end of the transmission gate transistor. The input end of the output stage circuit is coupled to the second end of the reset transistor. The output end of the output stage circuit outputs a temperature sensing signal or an image sensing signal.

16 Claims, 12 Drawing Sheets

IMAGE SENSING DEVICE CAPABLE OF SENSING IMAGES AND TEMPERATURES

BACKGROUND OF THE INVENTION

1. Field of the Invention

The invention generally relates to a sensing device, in particular, to an image sensing device.

2. Description of Related Art

A complementary metal-oxide-semiconductor (CMOS) image sensor is usually fabricated on a Si, GaAs, SiC, or SiGe substrate. For the purpose of image sensing, a CMOS image sensor usually includes a photo-sensing part, a signal conversion circuit, and an output circuit. The photo-sensing part senses a light source and transmits an obtained optical signal to a transmission circuit. The signal conversion circuit then converts the optical signal into an electric signal and transmits the electric signal to the output circuit.

In the related art, pixels of a normal image sensor usually has no temperature sensing function. The temperature sensor for the image sensor is usually disposed around or outside of the pixel array. This architecture cannot provide a precise temperature monitoring result for the whole pixel array.

SUMMARY OF THE INVENTION

Accordingly, the invention is directed to an image sensing device, where pixel circuits are capable of sensing images and temperatures.

An embodiment of the invention provides an image sensing device including a plurality of pixel circuits arranged in an array and configured to sense images and temperatures. Each of the pixel circuits includes a photo sensing device, a transmission gate transistor, a reset transistor and an output stage circuit. The photo sensing device includes a first end and a second end. The second end of the photo sensing device is coupled to a first voltage or a second voltage. The transmission gate transistor includes a first end, a second end and a control end. The first end of the transmission gate transistor is coupled to the first end of the photo sensing device. The control end of the transmission gate transistor is coupled to a first control signal. The reset transistor includes a first end, a second end and a control end. The first end of the reset transistor is coupled to a first power, a first current bias or a second current bias. The second end of the reset transistor is coupled to the second end of the transmission gate transistor. The control end of the reset transistor is coupled to a second control signal. The output stage circuit includes an input end and an output end. The input end of the output stage circuit is coupled to the second end of the reset transistor. The output end of the output stage circuit outputs a temperature sensing signal or an image sensing signal.

In an embodiment of the invention, the pixel circuit operates in a first mode or a second mode. When the pixel circuit operates in the first mode, the output end of the output stage circuit outputs the temperature sensing signal. When the pixel circuit operates in the second mode, the output end of the output stage circuit outputs the image sensing signal.

In an embodiment of the invention, when the pixel circuit operates in the first mode, the first end of the reset transistor is coupled to the first current bias or the second current bias, and the second end of the photo sensing device is coupled to the first voltage.

In an embodiment of the invention, when the pixel circuit operates in the second mode, the first end of the reset transistor is coupled to the first power, and the second end of the photo sensing device is coupled to the second voltage.

In an embodiment of the invention, the second voltage is a ground voltage or a voltage lower than the first voltage.

In an embodiment of the invention, the photo sensing device includes a photodiode. The photodiode and the transmission gate transistor are formed in the same well, which is isolated from other transistors.

In an embodiment of the invention, the temperature sensing signal is generated according to the first current bias and the second current bias.

In an embodiment of the invention, the output stage circuit includes a source follower and a row select transistor. The source follower includes a first end, a second end and a control end. The first end of the source follower is coupled to a second power. The control end of the source follower serves as the input end of the output stage circuit and is coupled to the second end of the reset transistor. The row select transistor includes a first end, a second end and a control end. The first end of the row select transistor is coupled to the second end of the source follower. The second end of the row select transistor serves as the output end of the output stage circuit and is coupled to a third current bias. The control end of the row select transistor is coupled to a row select signal.

An embodiment of the invention provides an image sensing device includes a plurality of pixel circuits arranged in an array and configured to sense images and temperatures. Each of the pixel circuits includes a photo sensing device, a transmission gate transistor, a reset transistor, a function select transistor and an output stage circuit. The photo sensing device includes a first end and a second end. The second end of the photo sensing device is coupled to a first voltage or a second voltage. The transmission gate transistor includes a first end, a second end and a control end. The first end of the transmission gate transistor is coupled to the first end of the photo sensing device. The control end of the transmission gate transistor is coupled to a first control signal. The reset transistor includes a first end, a second end and a control end. The first end of the reset transistor is coupled to a first power. The second end of the reset transistor is coupled to the second end of the transmission gate transistor. The control end of the reset transistor is coupled to a second control signal. The function select transistor includes a first end, a second end and a control end. The first end of the function select transistor is coupled to the second end of the transmission gate transistor. The second end of the function select transistor is coupled to a first current bias or a second current bias. The control end of the function select transistor is coupled to a third control signal. The output stage circuit includes an input end and an output end. The input end of the output stage circuit is coupled to the second end of the reset transistor. The output end of the output stage circuit outputs a temperature sensing signal or an image sensing signal.

In an embodiment of the invention, the pixel circuit operates in a first mode or a second mode. When the pixel circuit operates in the first mode, the output end of the output stage circuit outputs the temperature sensing signal. When the pixel circuit operates in the second mode, the output end of the output stage circuit outputs the image sensing signal.

In an embodiment of the invention, when the pixel circuit operates in the first mode, the second end of the function select transistor is coupled to the first current bias or the second current bias, and the second end of the photo sensing device is coupled to the first voltage.

In an embodiment of the invention, when the pixel circuit operates in the second mode, the second end of the function select transistor is coupled to the first power, and the second end of the photo sensing device is coupled to the second voltage.

In an embodiment of the invention, the second voltage is a ground voltage or a voltage lower than the first voltage.

In an embodiment of the invention, the photo sensing device includes a photodiode, and the photodiode and the transmission gate transistor are formed in the same well, which is isolated from other transistors.

In an embodiment of the invention, the temperature sensing signal is generated according to the first current bias and the second current bias.

In an embodiment of the invention, the output stage circuit includes a source follower and a row select transistor. The source follower includes a first end, a second end and a control end. The first end of the source follower is coupled to a second power. The control end of the source follower serves as the input end of the output stage circuit and is coupled to the second end of the reset transistor. The row select transistor includes a first end, a second end and a control end. The first end of the row select transistor is coupled to the second end of the source follower. The second end of the row select transistor serves as the output end of the output stage circuit and is coupled to a third current bias. The control end of the row select transistor is coupled to a row select signal.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
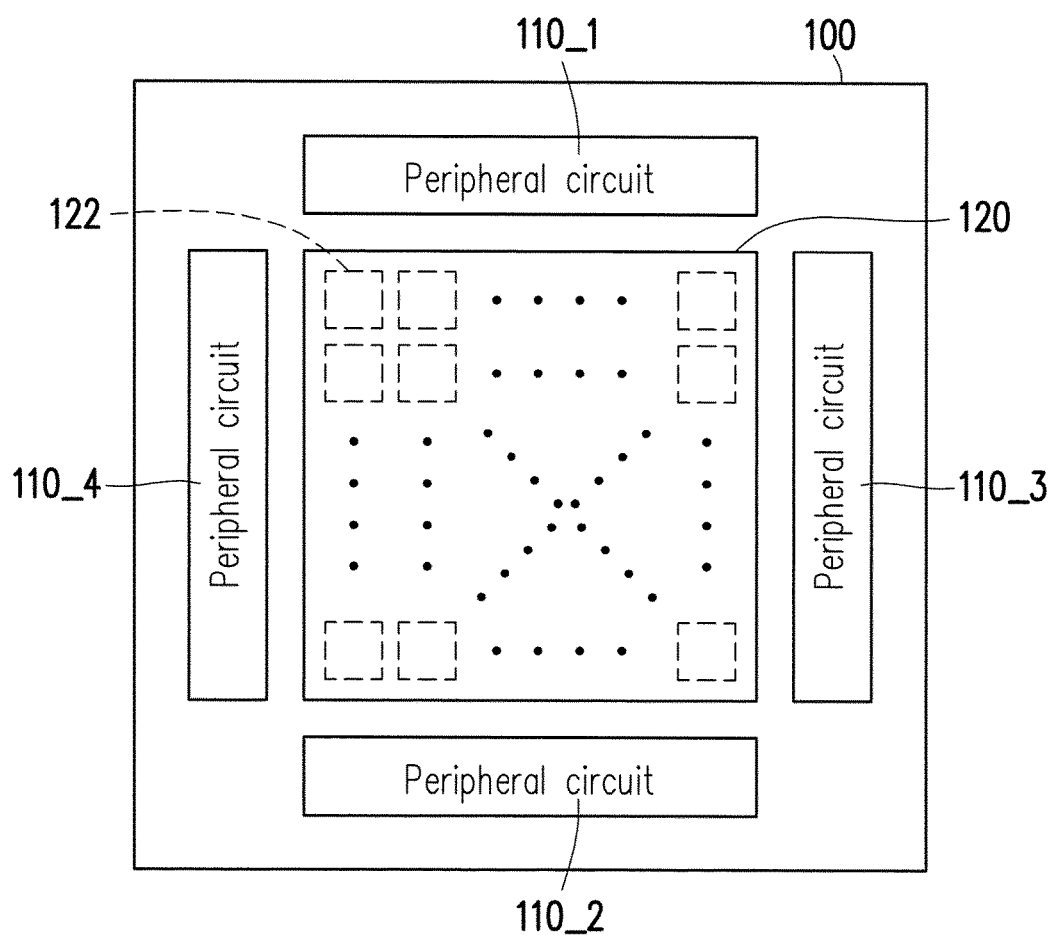
FIG. 1 illustrates a block diagram of an image sensing device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
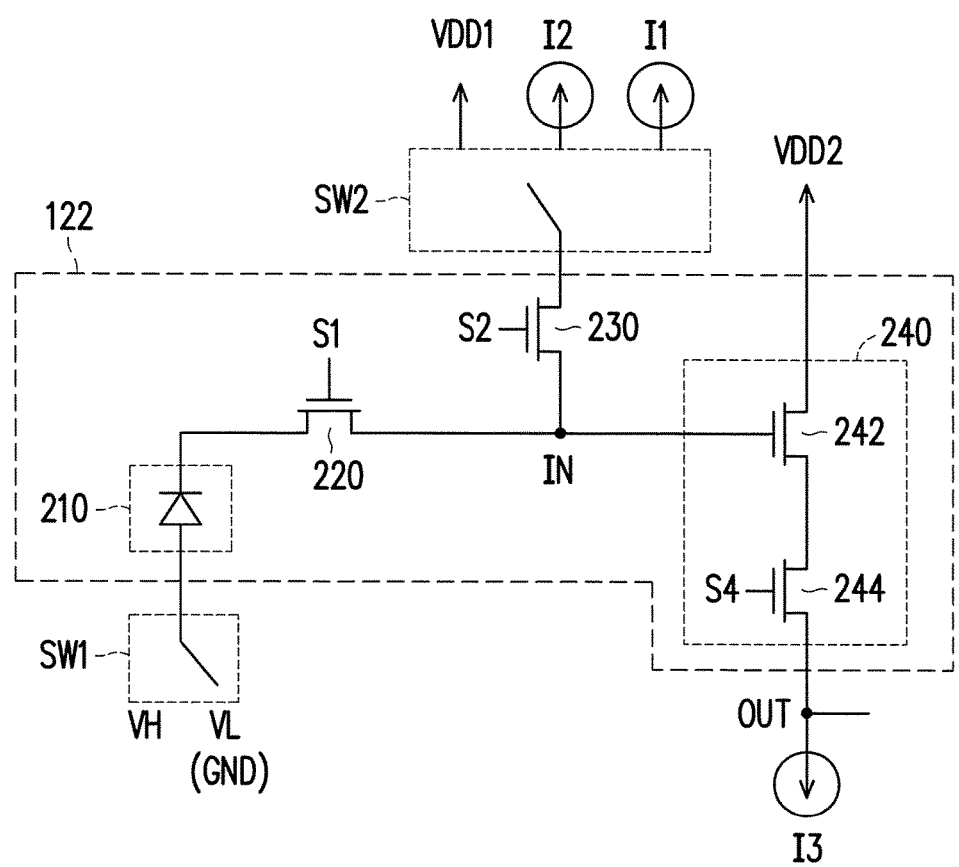
FIG. 2 illustrates a circuit diagram of a pixel circuit depicted in FIG. 1.

FIG. 1 illustrates a block diagram of an image sensing device according to an embodiment of the invention. FIG. 2 illustrates a circuit diagram of a pixel circuit depicted in FIG. 1. Referring to FIG. 1 and FIG. 2, the image sensing device of the present embodiment includes a plurality of peripheral circuits 110_1 to 110_4 and a pixel array 120. The peripheral circuits 110_1 to 110_4 drive or control the pixel array 120 to perform an image sensing operation or a temperature sensing operation. Enough teaching, suggestion, and implementation illustration for the structures of the peripheral circuits 110_1 to 110_4 and embodiments thereof may be obtained with reference to common knowledge in the related art.

In the present embodiment, the pixel array 120 includes a plurality of pixel circuits 122 for sensing images and temperatures. Each of the pixel circuits 122 includes a photo sensing device 210, a transmission gate transistor 220, a reset transistor 230 and an output stage circuit 240. The output stage circuit 240 includes a source follower 242 and a row select transistor 244.

In the present embodiment, the photo sensing device 210 includes a first end and a second end. The second end of the photo sensing device 210 is coupled to a first voltage VH or a second voltage VL through a switch element SW1. The second voltage VL may be a ground voltage GND or a voltage lower than the first voltage VH. The transmission gate transistor 220 includes a first end, a second end and a control end. The first end of the transmission gate transistor 220 is coupled to the first end of the photo sensing device 210. The control end of the transmission gate transistor 220 is coupled to a first control signal S1. In the present embodiment, the photo sensing device 210 may include a photodiode. The photodiode and the transmission gate transistor 220 are in the same well, which is isolated from other transistors such as the reset transistor 230, the source follower 242 and the row select transistor 244.

The reset transistor 230 includes a first end, a second end and a control end. The first end of the reset transistor 230 is coupled to a first power VDD1, a first current bias I1 or a second current bias I2 through a switch element SW2. The first power VDD1 may be a system voltage. The second end of the reset transistor 230 is coupled to the second end of the transmission gate transistor 220. The control end of the reset transistor 230 is coupled to a second control signal S2. The source follower 242 includes a first end, a second end and a control end. The first end of the source follower 242 is coupled to a second power VDD2. The value of the second power VDD2 may be the same as or different from that of the first power VDD1. The control end of the source follower 242 serves as an input end IN of the output stage circuit 240 and is coupled to the second end of the reset transistor 230. The row select transistor 230 includes a first end, a second end and a control end. The first end of the row select transistor 244 is coupled to the second end of the source follower 242. The second end of the row select transistor 244 serves as an output end OUT of the output stage circuit 240 and is coupled to a third current bias I3. A temperature sensing signal or an image sensing signal may be outputted via the output end OUT of the output stage circuit 240. The control end of the row select transistor 244 is coupled to a row select signal S4.

Figure 3A:
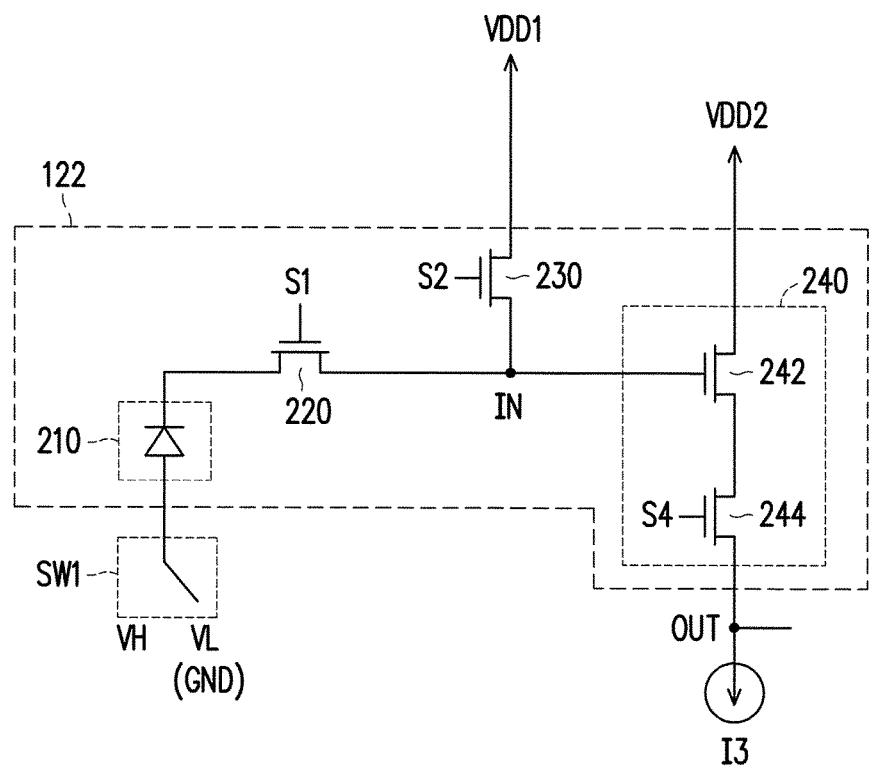
FIG. 3A illustrates a circuit diagram of the pixel circuit operating in the image sensing mode according to an embodiment of the invention.

In the present embodiment, the pixel circuit 122 may operate in a temperature sensing mode (the first mode) or an image sensing mode (the second mode). FIG. 3A illustrates a circuit diagram of the pixel circuit operating in the image sensing mode according to an embodiment of the invention. Referring to FIG. 2 and FIG. 3A, when the pixel circuit 122 operates in the image sensing mode, the first end of the reset transistor 230 is coupled to the first power VDD1, and the second end of the photo sensing device is coupled to the second voltage VL as depicted in FIG. 3A. In the image sensing mode, the pixel circuit 122 senses images, and the output end OUT of the output stage circuit 240 outputs the image sensing signal. Enough teaching, suggestion, and implementation illustration for the image sensing operation of the pixel circuit 122 may be obtained with reference to common knowledge in the related art.

Figure 3B:
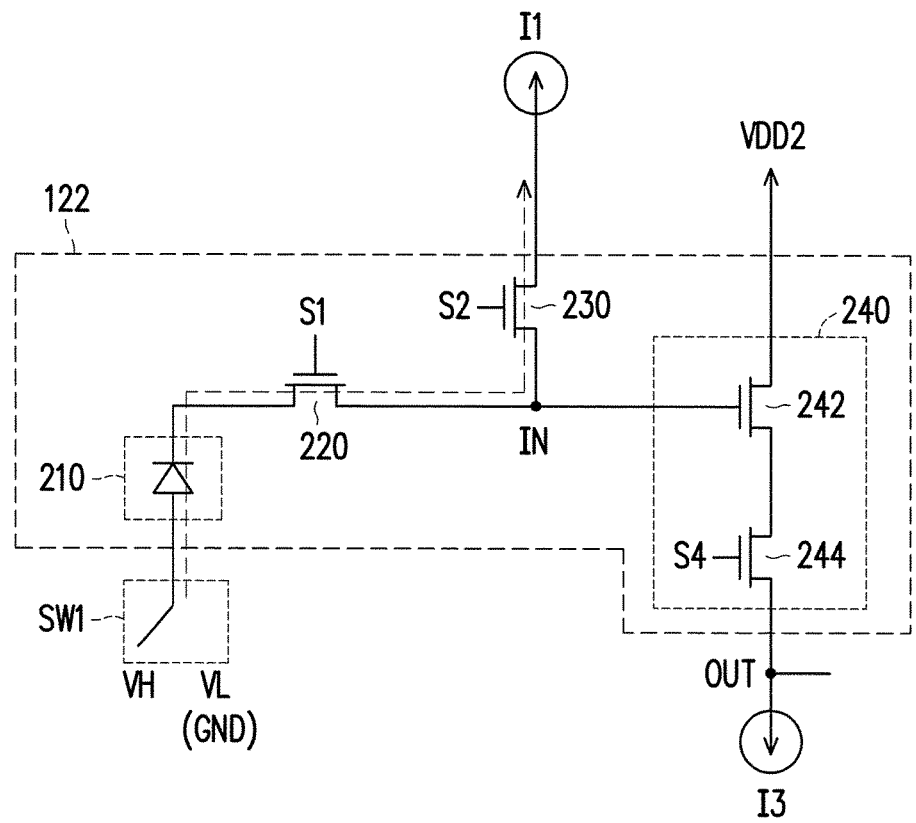
FIG. 3B and FIG. 3C illustrate a circuit diagram of the pixel circuit operating in the temperature sensing mode according to an embodiment of the invention.
Figure 3C:
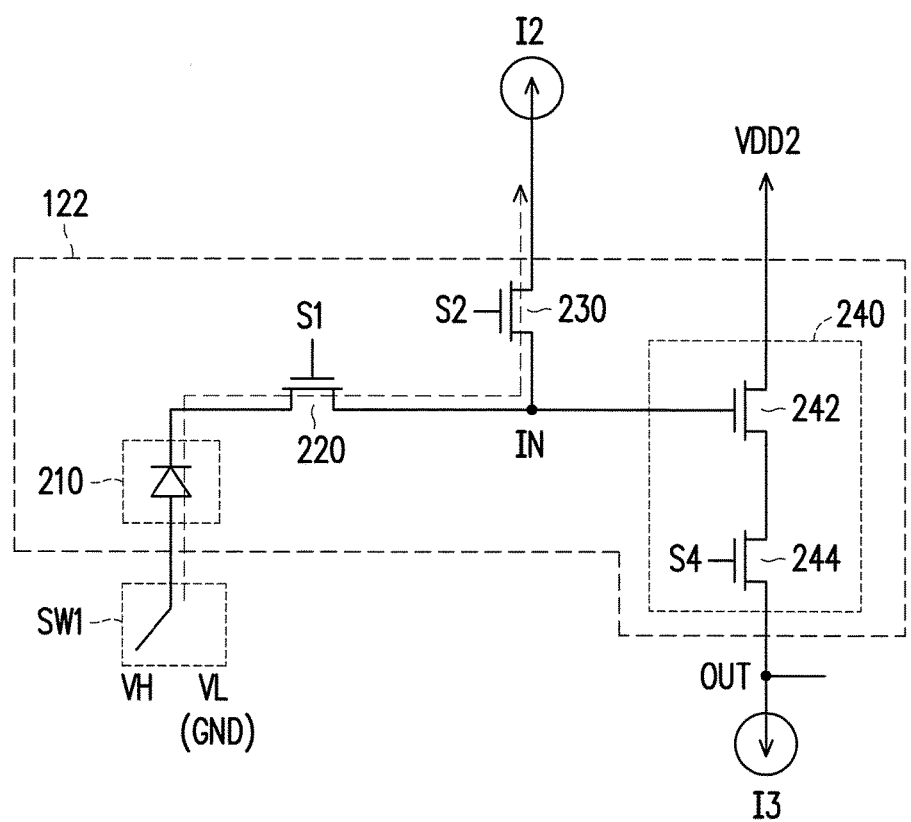

FIG. 3B and FIG. 3C illustrate a circuit diagram of the pixel circuit operating in the temperature sensing mode according to an embodiment of the invention. Referring to FIG. 2, FIG. 3B and FIG. 3C, in the temperature sensing mode, the switch element SW1 is switched to the first voltage VH, and the first end of the reset transistor 230 is coupled to the first current bias I1 or the second current bias I2 as depicted in FIG. 3B and FIG. 3C.

For example, in FIG. 3B, the control signals S1 and S2 respectively turn on the transmission gate transistor 220 and the reset transistor 230. The voltage drop in 210 is sensed by the pixel circuit 122. In FIG. 3C, the transmission gate transistor 220 and the reset transistor 230 are also turned on by the control signals S1 and S2 respectively. The voltage drop in 210 is sensed by the pixel circuit 122. The Shockley diode equation relates the diode current I1 and I2 of the photodiode, and the temperature information is generated according to the ratio of the two currents.

The Shockley diode equation is expressed as follows:

$$I = Is\left(e^{\frac{V_D}{nV_T}} - 1\right)$$

Where I is the diode current, $I_S$ is the reverse bias saturation current (or scale current), $V_D$ is the voltage across the diode, $V_T$ is the thermal voltage kT/q (Boltzmann constant times temperature divided by electron charge), and n is the ideality factor, also known as the quality factor or sometimes emission coefficient. For example, the diode current I1 may be expressed as I1=Is×exp($V_{D1}/V_T$), and the diode current I2 may be expressed as I2=Is×exp($V_{D2}/V_T$). Accordingly, the ratio of the two currents (I1/I2) may be calculated and is equal to exp((VD1−VD2)/$V_T$), where the diode currents I1 and I2 are known and the voltage drops VD1 and VD2 are measured, such that the thermal voltage $V_T$ and the temperature T can be obtained.

Figure 4:
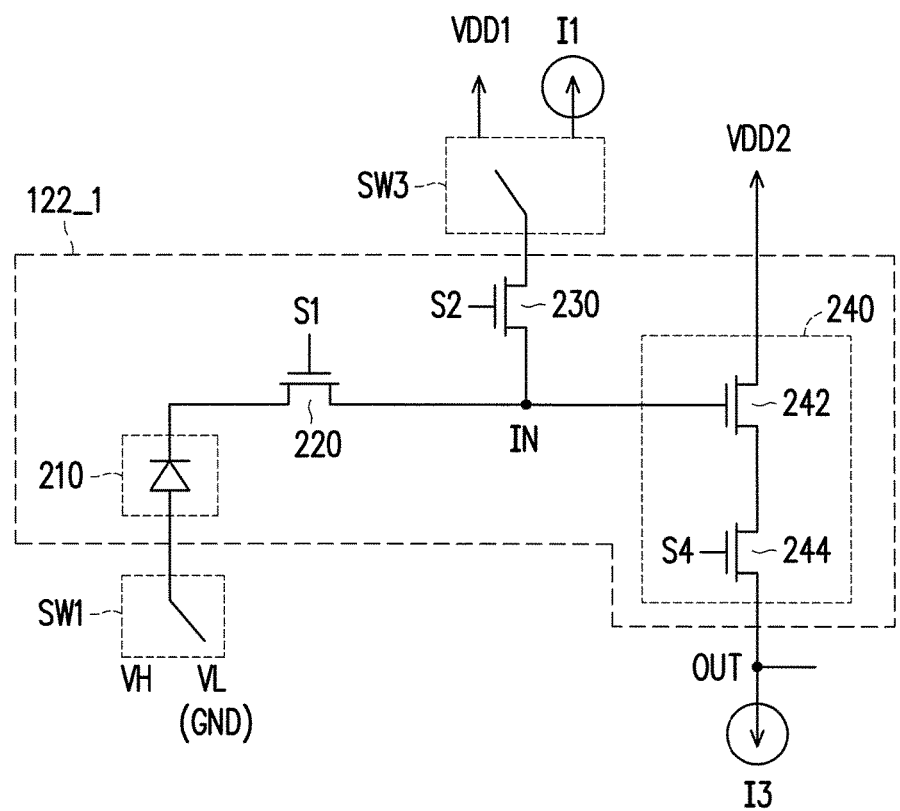
FIG. 4 and FIG. 5 respectively illustrate two neighboring pixel circuits located on the pixel array according to an embodiment of the invention.
Figure 5:
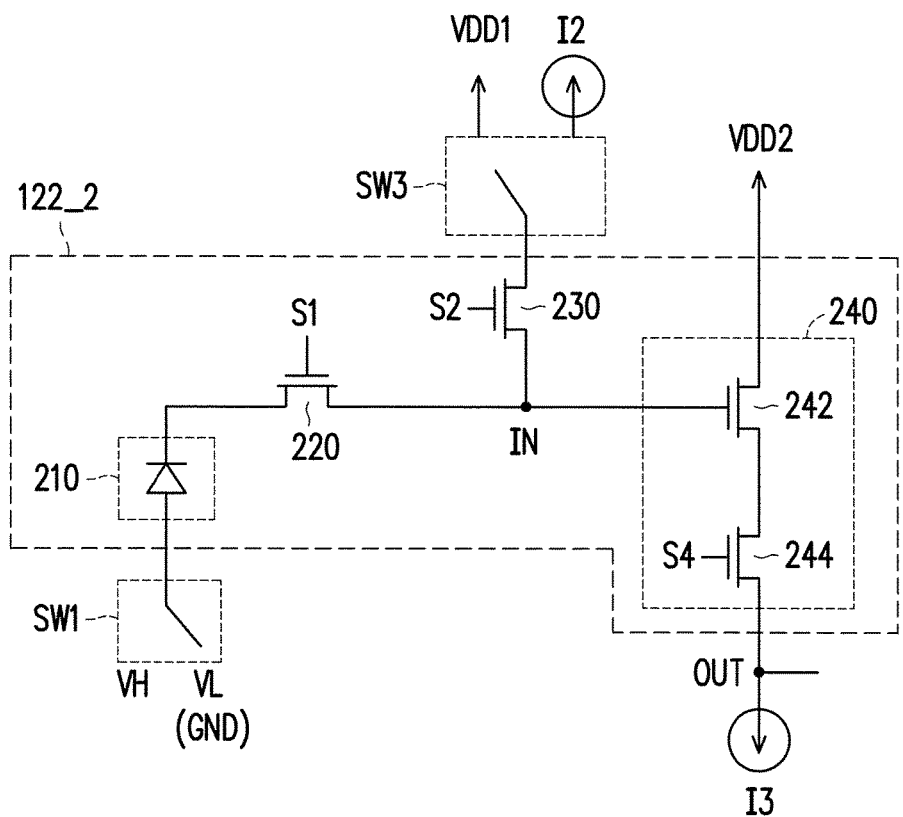

Note that the control signal S1 with a high voltage to turn on the transmission transistor 220 is not always necessary. In some embodiments, a current flow directly from the photodiode to the second end of the transmission transistor 210 is possible, and the voltage drop is generated from the photodiode to the second end of the transmission transistor 210. FIG. 4 and FIG. 5 respectively illustrate two neighboring pixel circuits located on the pixel array according to an embodiment of the invention. Referring to FIG. 2, FIG. 4 and FIG. 5, the pixel circuit 122_2 is next to the pixel circuit 122_1 on the pixel array 120. That circuit structure of the pixel circuit 122_1 is similar to that of the pixel circuit 122 depicted in FIG. 2, and the main difference therebetween, for example, lies in that the reset transistor 230 of the pixel circuit 122_1 is coupled to the first power VDD1 or the first current bias I1 through a switch element SW3. That circuit structure of the pixel circuit 122_2 is similar to that of the pixel circuit 122 depicted in FIG. 2, and the main difference therebetween, for example, lies in that the reset transistor 230 of the pixel circuit 122_2 is coupled to the first power VDD1 or the second current bias I2 through the switch element SW3.

In the present embodiment, the pixel circuits 122_1 and 122_2 may operate in the temperature sensing mode or the image sensing mode. The pixel circuits 122_1 and 122_2 are configured to sense temperatures around themselves respectively. The temperature sensing operation or the image sensing operation of the pixel circuits 122_1 and 122_2 in the present embodiment of the invention is sufficiently taught, suggested, and embodied in the exemplary embodiments illustrated in FIG. 1 to FIG. 3C, and therefore no further description is provided herein.

Figure 6:
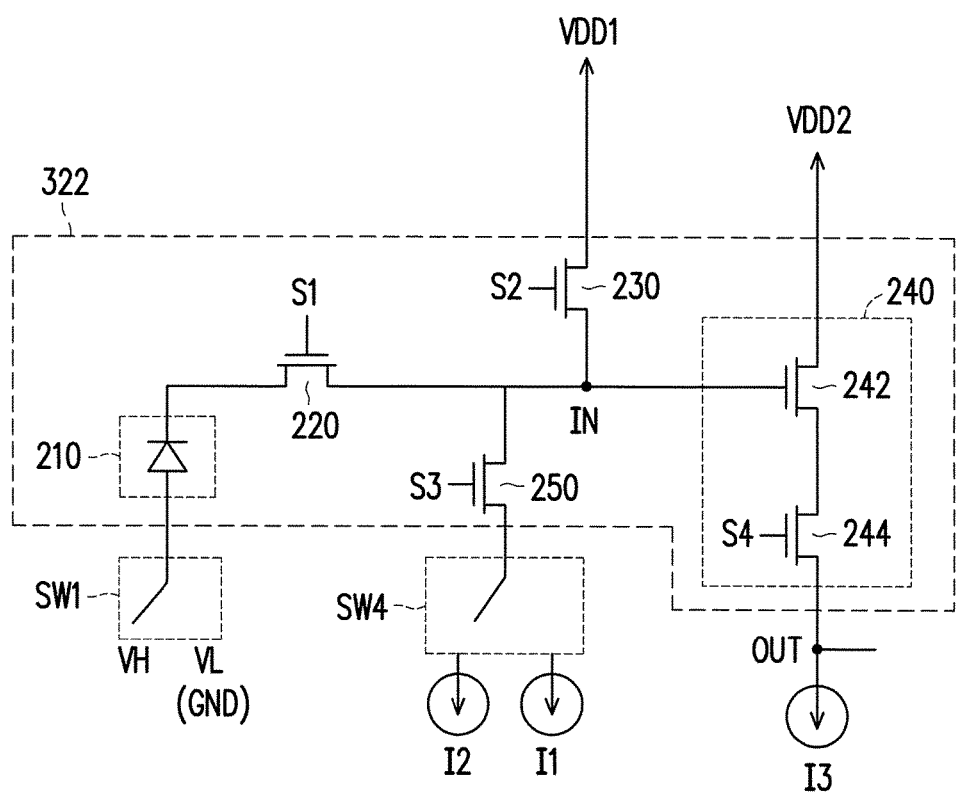
FIG. 6 illustrates a circuit diagram of a pixel circuit according to another embodiment of the invention.

FIG. 6 illustrates a circuit diagram of a pixel circuit according to another embodiment of the invention. Referring to FIG. 6, in the present embodiment, the pixel array 120 of the present embodiment includes a plurality of pixel circuits 322 for sensing images and temperatures. Each of the pixel circuits 322 includes a photo sensing device 210, a transmission gate transistor 220, a reset transistor 230, a function select transistor 250 and an output stage circuit 240. The output stage circuit 240 includes a source follower 242 and a row select transistor 244.

In the present embodiment, the first end of the reset transistor 230 is coupled to the first power VDD1. The function select transistor 250 includes a first end, a second end and a control end. The first end of the function select transistor 250 is coupled to the second end of the transmission gate transistor 220. The second end of the function select transistor 250 is coupled to the first current bias I1 or the second current bias I2 through a switch element SW4. The control end of the function select transistor is coupled to a third control signal S3.

In the present embodiment, the pixel circuit 322 may operate in the temperature sensing mode (the first mode) or the image sensing mode (the second mode). When the pixel circuit 322 operates in the image sensing mode, the control signal S3 turns off the function select transistor 250. The first end of the reset transistor 230 is coupled to the first power VDD1, and the second end of the photo sensing device is coupled to the second voltage VL in the image sensing mode. In the image sensing mode, the pixel circuit 322 senses images, and the output end OUT of the output stage circuit 240 outputs the image sensing signal. Enough teaching, suggestion, and implementation illustration for the image sensing operation of the pixel circuit 322 may be obtained with reference to common knowledge in the related art.

Figure 7A:
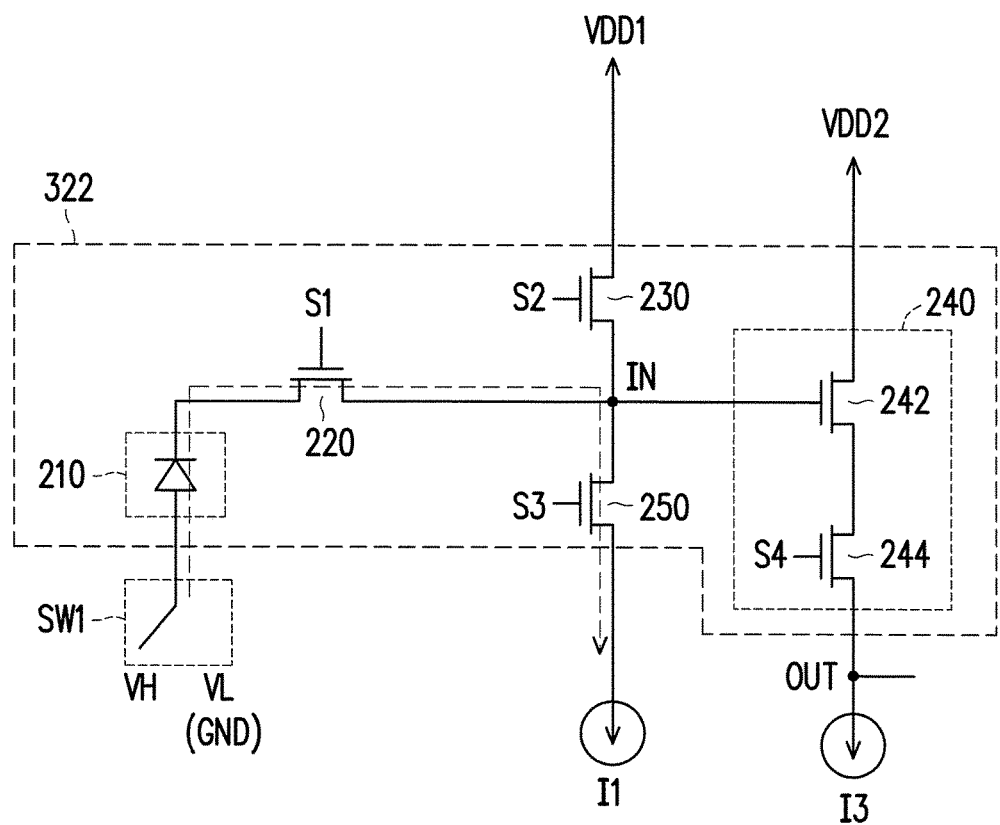
FIG. 7A and FIG. 7B illustrate a circuit diagram of the pixel circuit operating in the temperature sensing mode according to another embodiment of the invention.
Figure 7B:
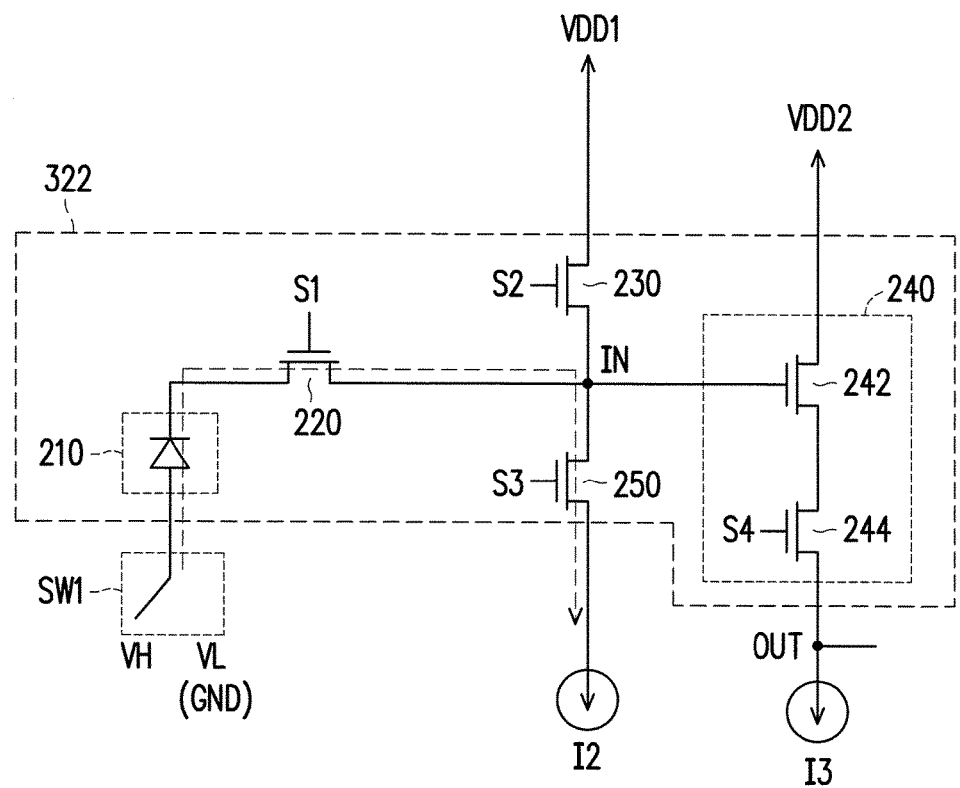

FIG. 7A and FIG. 7B illustrate a circuit diagram of the pixel circuit operating in the temperature sensing mode according to another embodiment of the invention. Referring to FIG. 6 to FIG. 7B, in the temperature sensing mode, the switch element SW1 is switched to the first voltage VH, and the second end of the function select transistor 250 is turned on by the control signal S3 and coupled to the first current bias I1 or the second current bias I2 as depicted in FIG. 7A and FIG. 7B.

For example, in FIG. 7A, the control signals S1 and S3 respectively turn on the transmission gate transistor 220 and the function select transistor 250, and the control signal S2 turns off the reset transistor 230. The voltage drop in the photo sensing device 210 is sensed by the pixel circuit 322. In FIG. 7B, the transmission gate transistor 220 and the function select transistor 250 are also turned on by the control signals S1 and S3 respectively, and the reset transistor 230 is turned off by the control signal S2. The voltage drop in the photo sensing device 210 is sensed by the pixel circuit 322. Shockley diode equation relates the diode current, and the temperature information is generated according to the two bias currents. Note that the control signal S1 with a high voltage to turn on the transmission transistor 220 is not always necessary. In some embodiments, a current flow directly from the photodiode to the second end of the transmission transistor 220 is possible, and the voltage drop is generated from the photodiode to the second end of transmission transistor.

Figure 8:
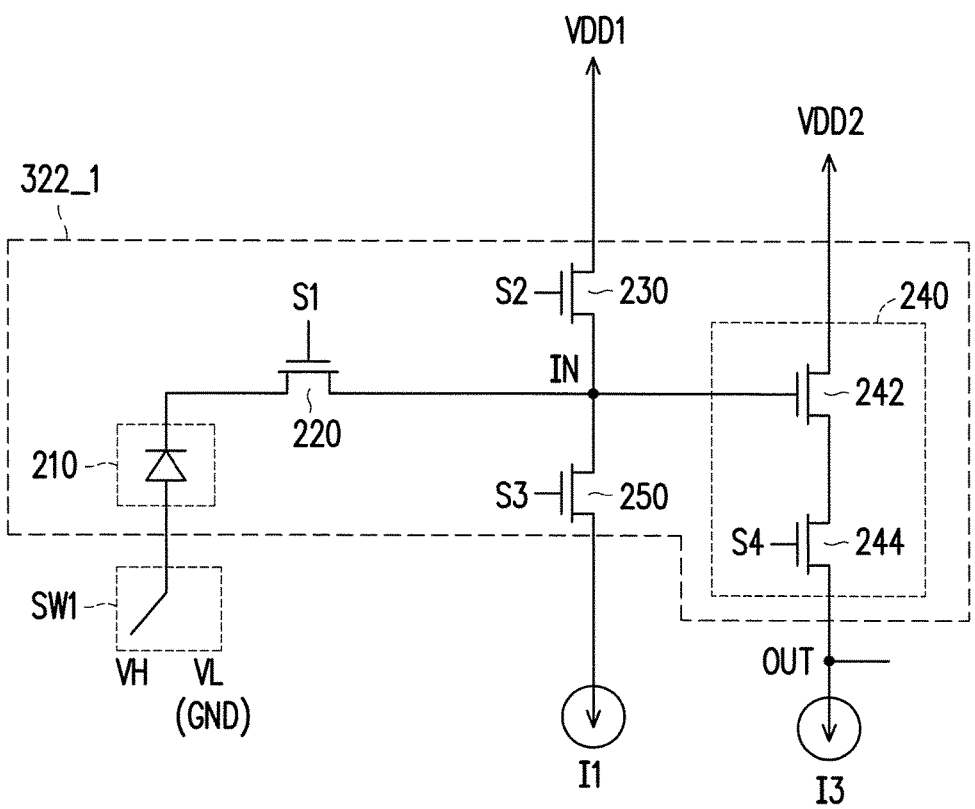
FIG. 8 and FIG. 9 respectively illustrate two neighboring pixel circuits located on the pixel array according to an embodiment of the invention.
Figure 9:
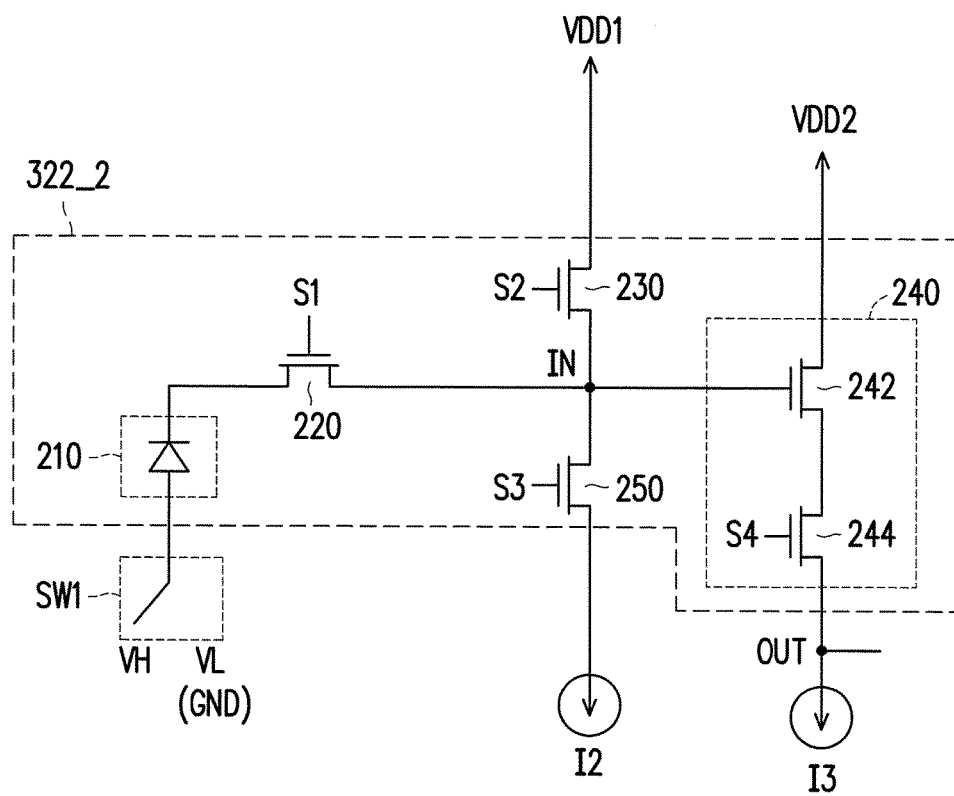

FIG. 8 and FIG. 9 respectively illustrate two neighboring pixel circuits located on the pixel array according to an embodiment of the invention. Referring to FIG. 6, FIG. 8 and FIG. 9, the pixel circuit 322_2 is near to the pixel circuit 322_1 on the pixel array 120. That circuit structure of the pixel circuit 322_1 is similar to that of the pixel circuit 322 depicted in FIG. 6, and the main difference therebetween, for example, lies in that the function select transistor 250 of the pixel circuit 322_1 is directly coupled to the first current bias I1 without through the switch element SW4. That circuit structure of the pixel circuit 322_2 is similar to that of the pixel circuit 322 depicted in FIG. 6, and the main difference therebetween, for example, lies in that the function select transistor 250 of the pixel circuit 322_2 is directly coupled to the second current bias I2 without through the switch element SW4.

In the present embodiment, since the pixel circuit 322_2 is near to the pixel circuit 322_1 on the pixel array 120, the temperature sensed by the pixel circuits 322_1 and 322_2 may be deemed as the same. The pixel circuit 322_1 is coupled to the first current bias I1, and the first current bias I1 may be expressed as $I1=I_s \times \exp(V_{D1}/V_T)$ based on Shockley diode equation. The pixel circuit 322_2 is coupled to the second current bias I2, and the second current bias I2 may be expressed as $I2=I_s \times \exp(V_{D2}/V_T)$ based on Shockley diode equation. Accordingly, the ratio of the two current biases (I1/I2) may be calculated and is equal to $\exp((V_{D1}-V_{D2})/V_T)$, where the two current biases I1 and I2 are known and the voltage drops $V_{D1}$ and $V_{D2}$ are measured, such that the thermal voltage $V_T$ and the temperature T can be obtained.

In the present embodiment, the pixel circuits 322_1 and 322_2 may operate in the temperature sensing mode or the image sensing mode. The pixel circuits 322_1 and 322_2 are configured to sense temperatures around themselves respectively. The temperature sensing operation or the image sensing operation of the pixel circuits 322_1 and 322_2 in the present embodiment of the invention is sufficiently taught, suggested, and embodied in the exemplary embodiments illustrated in FIG. 1 to FIG. 7B, and therefore no further description is provided herein.

In summary, in the exemplary embodiments of the invention, the image sensing device is capable of sensing images and temperatures. The pixel circuits may operate in the temperature sensing mode to sense temperatures or operate in the image sensing mode to sense image. Since the pixel circuits are uniformly distributed on the pixel array, the temperature of the whole pixel array may be precisely sensed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensing device comprising:
   a plurality of pixel circuits arranged in an array and configured to sense images and temperatures, wherein each of the pixel circuits comprises:
   a photo sensing device comprising a first end and a second end, wherein the second end of the photo sensing device is coupled to a first voltage or a second voltage;
   a transmission gate transistor comprising a first end, a second end and a control end, wherein the first end of the transmission gate transistor is coupled to the first end of the photo sensing device, and the control end of the transmission gate transistor is coupled to a first control signal;
   a reset transistor comprising a first end, a second end and a control end, wherein the first end of the reset transistor is coupled to a first power, a first current bias or a second current bias, the second end of the reset transistor is coupled to the second end of the transmission gate transistor, and the control end of the reset transistor is coupled to a second control signal; and
   an output stage circuit comprising an input end and an output end, wherein the input end of the output stage circuit is coupled to the second end of the reset transistor, and the output end of the output stage circuit outputs a temperature sensing signal or an image sensing signal.

2. The image sensing device according to claim 1, wherein the pixel circuit operates in a first mode or a second mode,
   when the pixel circuit operates in the first mode, the output end of the output stage circuit outputs the temperature sensing signal; and
   when the pixel circuit operates in the second mode, the output end of the output stage circuit outputs the image sensing signal.

3. The image sensing device according to claim 2, wherein when the pixel circuit operates in the first mode, the first end of the reset transistor is coupled to the first current bias or the second current bias, and the second end of the photo sensing device is coupled to the first voltage.

4. The image sensing device according to claim 2, wherein when the pixel circuit operates in the second mode, the first end of the reset transistor is coupled to the first power, and the second end of the photo sensing device is coupled to the second voltage.

5. The image sensing device according to claim 1, wherein the second voltage is a ground voltage or a voltage lower than the first voltage.

6. The image sensing device according to claim 1, wherein the photo sensing device comprises a photodiode, and the photodiode and the transmission gate transistor are formed in a same well.

7. The image sensing device according to claim 1, wherein the temperature sensing signal is generated according to the first current bias and the second current bias.

8. The image sensing device according to claim 1, wherein the output stage circuit comprises:
   a source follower comprising a first end, a second end and a control end, wherein the first end of the source follower is coupled to a second power, and the control end of the source follower serves as the input end of the output stage circuit and is coupled to the second end of the reset transistor; and a row select transistor comprising a first end, a second end and a control end, wherein the first end of the row select transistor is coupled to the second end of the source follower, the second end of the row select transistor serves as the output end of the output stage circuit and is coupled to a third current bias, and the control end of the row select transistor is coupled to a row select signal.

9. An image sensing device comprising:
a plurality of pixel circuits arranged in an array and configured to sense images and temperatures, wherein each of the pixel circuits comprises:
  a photo sensing device comprising a first end and a second end, wherein the second end of the photo sensing device is coupled to a first voltage or a second voltage;
  a transmission gate transistor comprising a first end, a second end and a control end, wherein the first end of the transmission gate transistor is coupled to the first end of the photo sensing device, and the control end of the transmission gate transistor is coupled to a first control signal;
  a reset transistor comprising a first end, a second end and a control end, wherein the first end of the reset transistor is coupled to a first power, the second end of the reset transistor is coupled to the second end of the transmission gate transistor, and the control end of the reset transistor is coupled to a second control signal;
  a function select transistor comprising a first end, a second end and a control end, wherein the first end of the function select transistor is coupled to the second end of the transmission gate transistor, the second end of the function select transistor is coupled to a first current bias or a second current bias, and the control end of the function select transistor is coupled to a third control signal; and
  an output stage circuit comprising an input end and an output end, wherein the input end of the output stage circuit is coupled to the second end of the reset transistor, and the output end of the output stage circuit outputs a temperature sensing signal or an image sensing signal.

10. The image sensing device according to claim 9, wherein the pixel circuit operates in a first mode or a second mode,
  when the pixel circuit operates in the first mode, the output end of the output stage circuit outputs the temperature sensing signal; and
  when the pixel circuit operates in the second mode, the output end of the output stage circuit outputs the image sensing signal.

11. The image sensing device according to claim 10, wherein when the pixel circuit operates in the first mode, the second end of the function select transistor is coupled to the first current bias or the second current bias, and the second end of the photo sensing device is coupled to the first voltage.

12. The image sensing device according to claim 10, wherein when the pixel circuit operates in the second mode, the second end of the function select transistor is coupled to the first power, and the second end of the photo sensing device is coupled to the second voltage.

13. The image sensing device according to claim 9, wherein the second voltage is a ground voltage or a voltage lower than the first voltage.

14. The image sensing device according to claim 9, wherein the photo sensing device comprises a photodiode, and the photodiode and the transmission gate transistor are formed in a same well.

15. The image sensing device according to claim 9, wherein the temperature sensing signal is generated according to the first current bias and the second current bias.

16. The image sensing device according to claim 9, wherein the output stage circuit comprises:
  a source follower comprising a first end, a second end and a control end, wherein the first end of the source follower is coupled to a second power, and the control end of the source follower serves as the input end of the output stage circuit and is coupled to the second end of the reset transistor; and
  a row select transistor comprising a first end, a second end and a control end, wherein the first end of the row select transistor is coupled to the second end of the source follower, the second end of the row select transistor serves as the output end of the output stage circuit and is coupled to a third current bias, and the control end of the row select transistor is coupled to a row select signal.

* * * * *